United States Patent [19]

Yializis et al.

[11] Patent Number: 4,842,893
[45] Date of Patent: Jun. 27, 1989

[54] HIGH SPEED PROCESS FOR COATING SUBSTRATES

[75] Inventors: Angelo Yializis; David G. Shaw, both of Tucson, Ariz.; Donald S. Strycker, Glen Falls; Mooyoung Ham, Scotia, both of N.Y.

[73] Assignee: Spectrum Control, Inc., Erie, Pa.

[21] Appl. No.: 188,036

[22] Filed: Apr. 29, 1988

Related U.S. Application Data

[63] Continuation-in-part of Ser. No. 946,146, Dec. 22, 1986, which is a continuation of Ser. No. 620,647, Jun. 14, 1984, abandoned, which is a continuation-in-part of Ser. No. 562,779, Dec. 19, 1983, abandoned.

[51] Int. Cl.$^4$ ............................................. B05D 3/06
[52] U.S. Cl. ..................................... 427/44; 427/81; 427/251; 427/255.5; 427/255.6; 427/295; 427/296; 427/383.7; 427/388.1; 427/389.9; 427/391; 427/393.5; 427/394; 427/395
[58] Field of Search ................. 427/44, 81, 251, 255.5, 427/255.6, 295, 296, 383.7, 388.1, 389.9, 391, 393.5, 394, 395

[56] References Cited

U.S. PATENT DOCUMENTS

| | | | |
|---|---|---|---|
| 1,873,548 | 8/1932 | Cole | 29/25.42 X |
| 2,389,420 | 11/1945 | Deyrup | 29/25.42 X |
| 2,590,906 | 4/1952 | Tripp | 88/110 |
| 2,614,524 | 10/1952 | Haynes | 118/720 |
| 2,734,478 | 2/1956 | Reynolds et al. | 118/665 |
| 2,820,934 | 1/1958 | Mullikin | 361/308 |
| 3,024,394 | 3/1962 | Salisbury | 29/25.42 X |
| 3,068,510 | 12/1962 | Coleman | 18/2 |

(List continued on next page.)

FOREIGN PATENT DOCUMENTS

| | | |
|---|---|---|
| 660489 | 7/1965 | Belgium . |
| 789746 | 7/1968 | Canada . |
| 0009806 | 4/1980 | European Pat. Off. . |
| 0045058 | 2/1982 | European Pat. Off. . |
| 2641232 | 9/1976 | Fed. Rep. of Germany ..... 29/25.42 |
| 2737509 | 3/1979 | Fed. Rep. of Germany ..... 29/25.42 |
| 2759118 | 7/1979 | Fed. Rep. of Germany ..... 29/25.42 |
| 3231576 | 3/1984 | Fed. Rep. of Germany . |
| 2440604 | 10/1979 | France . |
| 55-27455 | 7/1980 | Japan ................................... 29/25.42 |
| 58-74701 | 5/1983 | Japan . |
| 59-177365 | 10/1984 | Japan . |
| 313676 | 6/1956 | Switzerland ........................ 361/273 |
| 550419 | 1/1943 | United Kingdom ................ 361/306 |
| 762953 | 12/1956 | United Kingdom . |
| 970865 | 9/1960 | United Kingdom . |
| 1104172 | 2/1968 | United Kingdom . |
| 1168641 | 10/1969 | United Kingdom . |
| 1253124 | 11/1971 | United Kingdom . |
| WO82/00542 | 2/1982 | World Int. Prop. O. . |

OTHER PUBLICATIONS

"Thin-Film Multilayer Capacitors Using Pyrolytically Deposited Silicon Dioxide", Richard A. Bailey, and Joseph H. Nevin, IEEE Transactions on Parts, Hybrids and Packaging, vol. PHP-12, pp. 361-364, No. 4, Dec. 1976.
Research Report, "IC-Components with Monolithic Thin Layer Capacitors", Report #BMFT-FB-T 83-049, sponsored by the Federal Ministry for Research and Technology, Apr. 1983, German document and translation.
"Formation of Thin Polymer Films by Electron Bombardment", Robert W. Christy, pp. 1680-1683, 1960.
"Preparation and Properties of Dielectric Layers Formed by Surface Irradiation Techniques", Peter White, pp. 52-58, 1967.
"Polymerization of Butadiene Gas on Surfaces Under Low Energy Electron Bombardment", I. Haller and P. White, pp. 1784-1788, 1963.

Primary Examiner—Bernard Pianalto
Attorney, Agent, or Firm—Marshall, O'Toole, Gerstein, Murray & Bicknell

[57] ABSTRACT

A high-speed process for coating substrates with thin organic coatings in a vacuum is disclosed and claimed. The process utilizes relatively low boiling, reactive monomers (e.g., polyacrylates) which are flash vaporized, condensed on the substrates and cured, in situ. The resultant cured films are pin-hole free and exhibit excellent adhesion. The process is capable of being run at very high coating and curing speeds, e.g., between 1 and 1000 cm/second.

20 Claims, 6 Drawing Sheets

U.S. PATENT DOCUMENTS

| | | | |
|---|---|---|---|
| 3,081,201 | 3/1963 | Koller | 427/81 |
| 3,123,490 | 3/1964 | Bolomey et al. | 106/291 |
| 3,237,273 | 3/1966 | Gunter et al. | 29/25.42 |
| 3,244,953 | 4/1966 | Walsh et al. | 361/323 |
| 3,252,830 | 5/1966 | Cummin et al. | 361/323 X |
| 3,326,718 | 6/1967 | Dill | 29/25.42 X |
| 3,457,614 | 7/1969 | Tibol | 29/25.42 |
| 3,466,719 | 9/1969 | Sharif et al. | 361/313 X |
| 3,520,987 | 7/1970 | Ohlrich | 361/328 X |
| 3,547,683 | 11/1970 | Williams et al. | 427/36 |
| 3,617,834 | 11/1971 | Rayburn | 29/25.42 X |
| 3,654,532 | 4/1972 | Rayburn | 361/323 X |
| 3,743,532 | 7/1973 | Wright et al. | 117/93.31 |
| 3,819,990 | 6/1974 | Hayashi et al. | 29/25.42 X |
| 4,076,866 | 2/1978 | Platakis et al. | 427/250 |
| 4,121,537 | 10/1978 | Maruyama et al. | 118/664 |
| 4,153,925 | 5/1979 | Gazard et al. | 361/323 |
| 4,207,836 | 6/1980 | Nonaka | 118/664 |
| 4,261,798 | 4/1981 | Palmer | 203/9 |
| 4,277,516 | 7/1981 | Behn et al. | 427/81 |
| 4,290,384 | 9/1981 | Ausschnitt et al. | 118/722 |
| 4,301,580 | 11/1981 | Wallace | 29/25.42 |
| 4,301,765 | 11/1981 | Behn et al. | 118/718 |
| 4,329,419 | 5/1982 | Goff et al. | 430/283 |
| 4,356,608 | 11/1982 | Behn et al. | 29/25.42 |
| 4,363,162 | 12/1982 | Price | 29/25.42 |
| 4,376,329 | 3/1983 | Behn et al. | 29/25.42 |
| 4,378,382 | 3/1983 | Behn | 427/9 |
| 4,379,182 | 4/1983 | Behn et al. | 427/41 |
| 4,387,113 | 6/1983 | Behn | 427/40 |
| 4,403,381 | 9/1983 | Zeitlarn et al. | 29/25.42 |
| 4,414,722 | 11/1983 | Wehnelt | 29/25.42 |
| 4,434,452 | 2/1984 | Hamabe et al. | 361/273 |
| 4,453,199 | 6/1984 | Ritchie et al. | 29/25.42 X |
| 4,490,774 | 12/1984 | Olson et al. | 361/311 |
| 4,502,095 | 2/1985 | Pachonik | 361/273 |
| 4,508,049 | 4/1985 | Behn et al. | 118/50.1 |
| 4,533,710 | 8/1985 | Olson et al. | 526/323.2 |
| 4,543,275 | 9/1985 | Akashi et al. | 427/250 |

HIGH SPEED PROCESS FOR COATING SUBSTRATES

FIELD OF THE INVENTION

This application is a continuation-in-part of application Ser. No. 06/946,146 filed Dec. 22, 1986 which is a continuation of application Ser. No. 06/620,647 filed June 14, 1984, now abandoned, which is a continuation-in-part of application Ser. No. 562,779 filed Dec. 19, 1983, now abandoned.

The present invention relates generally to a method for coating substrates with a uniform adherent coating. More particularly, the invention discloses a process for condensing vaporized, unsaturated monomers on a rapidly-moving substrate and curing the deposited monomer, in situ, by employing a radiation source such as electron beam, U.V. radiation, or the like. The resultant cured films are extremely thin—generally less than 4 microns thick—but function as protective coatings for the underlying substrate or as a base for a subsequent coating.

This invention is related to the following copending, commonly assigned, patent applications: Ser. No. 562,873, filed Dec. 19, 1983, entitled "Capacitor With Resin Dielectric and Method Of Making"; Ser. No. 562,871, filed Dec. 19, 1983, entitled "Capacitors Containing Polyfunctional Acrylate Polymers as Dielectrics"; Ser. No. 562,893, filed Dec. 19, 1983, entitled "1; 2-Alkanediol Diacrylate Monomers and Polymers Thereof Useful As Capacitor Dielectrics"; Ser. No. 562,872, filed Dec. 19, 1983, entitled "Acrylate-Containing Mixed Ester Monomers And Polymers Thereof Useful as Capacitors Dielectrics; and Ser. No. 562,894, filed Dec. 19, 1983, entitled "Polyfunctional Acrylate Monomers For Polymers Thereof Useful as Capacitor Dielectrics", all of which are hereby incorporated by reference. This application is also related to Ser. No. 07/187,960 filed Apr. 29, 1988, filed simultaneously herewith.

BACKGROUND OF THE INVENTION

There are increasing numbers of applications for articles coated with thin films of organic coatings. For example, an economically produced thin film coating having particular properties can be used in food packaging or as a protective coating for metal or other substrates used in information display, medicine, instrumentation. While coating systems are available in the art, unfortunately, systems presently available operate at speeds which are too slow to be economically justified or the coating produced is not satisfactory for the particular substrate to be coated or the environment in which the substrate exists.

Illustrative of such systems is a coating process disclosed in British patent specification No. 1,168,641 published Oct. 29, 1969. That process involves coating substrates by vaporizing a reactive material which is deposited (under vacuum) on the surface of a substrate. The coated substrate is then exposed to electron beam, X-rays, or gamma rays in order to cross-link or cure the deposited material. The British reference discloses a number of polymers and monomers which can be employed as reactive materials, including monomeric acrylates having a single, reactive double bond. The rate of deposition of curable materials, however, is not satisfactory for many applications; the deposition rate being disclosed as one micron/second with the curing being accomplished in times varying from one second to one minute.

It is an object of the present invention to provide a thin film coating which can be produced relatively economically and at a relatively high speed of production.

It is further an object of the present invention to provide a coating structure that has mechanical and electrical properties which are useful in a variety of coating applications.

SUMMARY OF THE INVENTION

The invention disclosed and claimed herein serves to achieve the desired objectives and to obviate problems associated with the prior art. The present invention proivdes for a method of coating a substrate with a cured coating at an extremely rapid rate. The coating is quite thin, and has the designed properties sought for many applications in that it is substantially continuous (i.e., pinhole and void free) as well as substantially delamination free. In contrast to procedures heretofore utilized in the art, such as recited in British patent specification No. 1,168,641, which disclose maximum coating speeds in the range of $1\times10^{-3}$ cm/sec, the process of the present invention operates optimally at a rate of 100 cm/sec—five orders of magnitude faster.

The method of the present invention provides a process for coating a substrate with a continuous polymer film. The resultant films formed by the method of the present invention have a thickness of less than four microns, and preferably less than two microns. Continuous uniform films at least as thin as 0.1 microns can be fabricated. The films are formed by depositing a vapor of curable monomer, under vacuum, on a movable substrate which is mounted in thermal contact with a rotating drum which is maintained at a temperature below the boiling point of the vaporized monomer. As a result of this temperature differential, the monomer vapor condenses on the surface of the substrate.

The monomeric materials utilized in the present invention are relatively low in moilecular weight, between 150 and 1000, and preferably in the range 200 to 300. Polyfunctional acrylates or mixtures of monofunctional acrylates and polyfunctional acrylates are especially preferred. The monomers or monomer mixtures employed have an average of about two or more double bonds (i.e., a plurality of olefinic groups) and have vapor pressure between about $1\times10^{-6}$ Torr and $1\times10^{-1}$ Torr, most preferably a vapor pressure of approximately $10^{-2}$ Torr at standard temperature and pressure, (i.e., relatively low boiling materials). These high-vapor-pressure monomers can be flash vaporized at relatively low temperatures and thus are not degraded (cracked) by the heating process. The absence of unreactive degradation products means that films formed from these low molecular weight, high-vapor-pressure monomers have reduced levels of volatile components. As a result, substantially all of the deposited monomer is reactive and will cure to form an integral film when exposed to a source of radiation. These properties make it possible to provide a substantially continuous coating despite the fact that the deposited film is vèry thin. The cured films exhibit excellent adhesion and are resistant to chemical attack by organic solvents and inorganic salts.

Specifically, in one embodiment, the process of the invention is carried out in an vacuum chamber containing a movable support such as a rotating drum, the surface of which is maintained at a temperature sufficient to permit condensation of a material deposited thereon. Although the temperature will vary depending on the monomer (or monomer mixture) utilized, generally a temperature in the range of about 40°–70° C. will be appropriate.

A vapor outlet of a flash vaporizer is mounted adjacent to an upstream portion of the support and a curing means is mounted adjacent to a downstream portion of the support. The chamber is evacuated until the pressure is less than about $1 \times 1^{-1}$ Torr and preferably $1 \times 10^{-5}$ Torr. A curable monomer component with the properties mentioned above is metered to a heated flash vaporizer system where the material is atomized, vaporized and condensed on the surface of the movable support which travels at a speed of between 1 and 1000 cm/second. The condensed film is less than 4 microns thick.

Curing is accomplished by opening the double bonds of the reactant molecules. This can be accomplished by means of an energy source such as apparatus which emits infra red, electron beam, thermionic or ultra violet radiation.

The process of the present invention is particularly suitable for coating flexible substrates such as paper, fabrics, thin metal, plastics such as polyesters, polyethers, polyolefins, and the like, or virtually any flexible material. After curing, the film-covered substrate can be coated with additional materials, such as metals (e.g., aluminum) or other polymers. The products of the coating operation can be used, for example, in optical filters, coatings for window treatments, or coatings for packaging.

BRIEF DESCRIPTION OF THE DRAWINGS

Other aspects of the present invention will become apparent to one of ordinary skill upon consideration of the following detailed description and reference to the attached drawings, in which.

DETAILED DESCRIPTION

While the invention will be described in connection with preferred embodiments and procedures, it will be understood that we do not intend to limit the invention to those embodiments or procedures. On the contrary, we intend to cover all alternatives, modifications and equivalents as may be included within the spirit and scope of the invention as defined by the appended claims.

Figure 1:
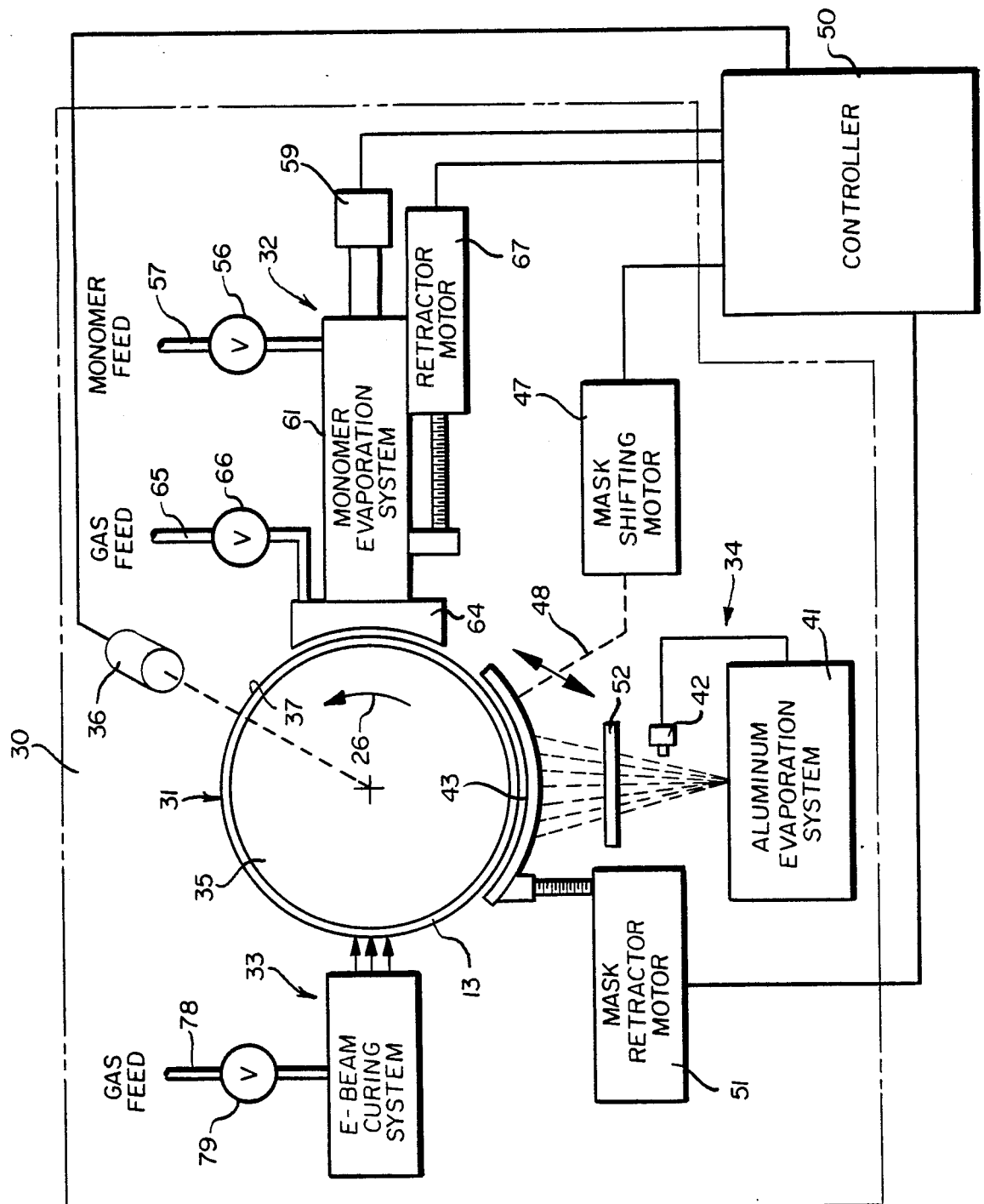
FIG. 1 shows a schematic view of one embodiment of apparatus and system for carrying out the process of the invention.

One form or embodiment for practicing the method of the present invention is illustrated in FIG. 1 which illustrates apparatus arranged within and around a chamber 30 which is either a vacuum chamber capable of maintaining a vacuum, or a housing divided into vacuum portions. Within a vacuum environment is a movable support in the form of a movable support 31, a dielectric or monomer deposit system 32, a monomer curing system 33, and an optional metal material deposit system 34. A substantial vacuum is required, down to the order of $1 \times 10^{-5}$ Torr.

Movable support 31 is a water cooled drum 35 driven by a motor 36 whose outer cylindrical surface 37 defines a rapidly moving continuous surface passing through a dielectric or polymer layer forming zone and an optional metal forming zone. The regions in which the drum surface 37 and the systems 32, 33 are located constitute the dielectric or polymer layer forming zone, and the region in which the drum surface 37 and the system 34 are located constitute a metal forming zone. Drum rotation creates the machine direction 26, which is the direction the surface or support passes through the upstream dielectric forming zone and the downstream metal forming zone.

Because of the small dimensions involved, the surface 37 should be smooth and true. A sheet or substrate 13 of a flexible material is firmly secured to the drum 35 and, when in place, the outer surface of the substrate defines the surface 37. The drum 35 is cooled to a temperature specific to the particular monomer being used and generally in the range of 20° C. to 80° C. to facilitate condensation of the vapor deposits, and the apparatus functions at drum surface speeds of 1 to 1000 cm/second.

The optional metal/inorganic material deposit system 34 includes a conventional electron beam vaporization device 41 or a group of resistive evaporation sources (boats) such as those used for metallizing film within a vacuum environment or a sputtering target. The rate of vaporization can be sensed by a quartz monitoring device 42 providing feedback for controlling the rate at which aluminum is vaporized by the device 41. The pattern in which aluminum vapor is deposited can be controlled by a mask, in this case a shadow mask 43, having openings through which the vapor passes.

Figure 5:
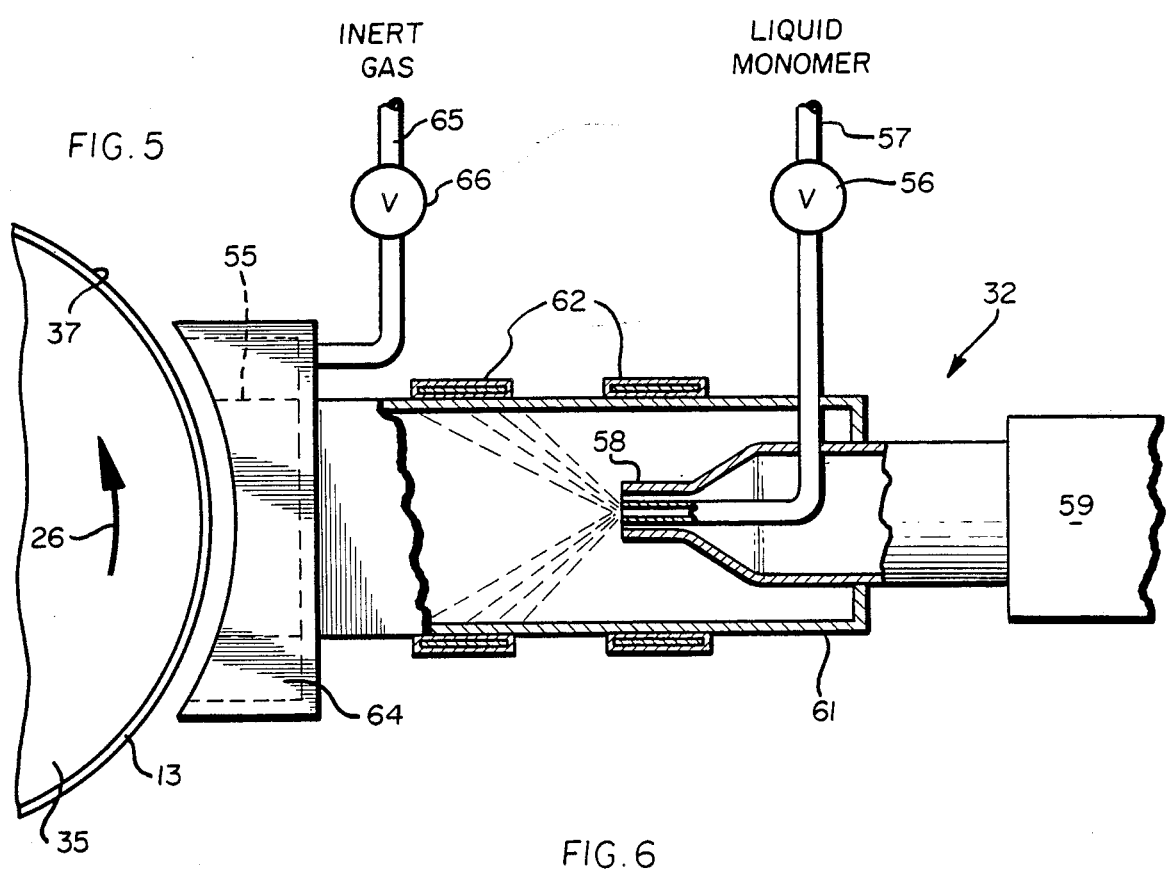
FIG. 5 shows an enlarged, partially sectioned, diagram of a portion of the apparatus shown in FIG. 1.

Referring now to FIGS. 1 and 5, as a feature of the invention, the dielectric deposit system 32 flash vaporizes a dielectric in monomer form, and the smaller gaseous molecules are guided under moderate differential pressure through nozzles 64 onto the surface 37 of substrate 13.

The monomeric materials employed in the process should provide an average of about two or more olefinic groups per molecule. By way of example, a single diolefinic material, mixtures of two diolefins, or mixtures containing a polyolefin and a monolefin can be employed. If multiple components are utilized, the components can be metered into an evaporator individually or as a single mixture.

Due to their low molecular weight and the presence of an average of about two or more olefinic groups, the monomers (or monomer mixtures) utilized are highly reactive. As a result, the monomers can be deposited and cured at rapid speeds, viz, 1 to 1000 cm/sec.

Because of their reactivity, physical properties, and the properties of cured films formed from such components, polyfunctional acrylates are particularly useful monomeric materials. The general formula for such polyfunctional acrylates is:

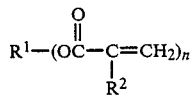

wherein:

$R^1$ is an aliphatic, alicyclic or mixed aliphatic-alicyclic radical derived from a compound of the formula $R^1(OH)_m$;

$R^2$ is hydrogen, methyl, ethyl, propyl, butyl or pentyl;

n is from 2 to 4;

m is 2 or more.

Such polyfunctional acrylates may also be used in combination with various monoacrylates, such as those having the formula:

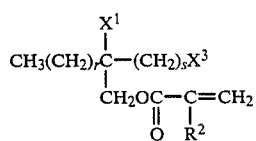

wherein:

$R^2$, r and 2 are defined above;

$x^1$ is H or:

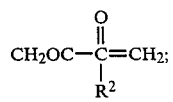

and $X^3$ is CN or $COOR^3$ wherein $R^3$ is an alkyl radical containing 1-4 carbon atoms. Most often, $X^3$ is CN or $COOCH_3$.

Diacrylates of the formula below are particularly preferred:

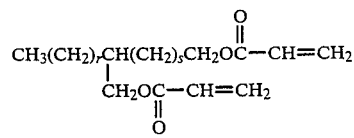

wherein:

r and s are each 7 or 8 and the sum of r and s is 15.

The diacrylates:

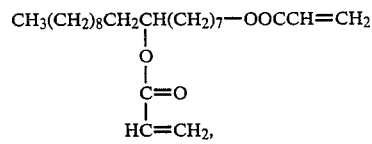

and alkoxylated cyclohexane dimethanol diacrylates (wherein the alkoxy group contains 1 to 4 carbon atoms) are especially suitable.

The monomer in liquid form is fed through a line 57 and control valve 56 to the open end of the horn 58 of an ultrasonic atomizer 59. The resulting micro droplets impinge on the inner wall of a vaporization tube 61 heated by band heaters 62 to an appropriate temperature, approximately 100°-400° C. for the acrylate resins referred to above. The liquid is thus instantaneously vaporized, i.e., flash vaporized, so as to minimize the opportunity for polymerization prior to being deposited on the substrate.

Pressure in the tube 61, at about 1 Torr, causes a monomer gas stream to flow through nozzles 55 for deposition and condensation. The nozzles 55 are heated by conduction from the tube 61 to minimize condensation before the gas stream leaves the nozzles.

The thickness of the monomeric coating is dependent upon the time of deposit, i.e., the length of the nozzles 55 relative to the speed of the surface 37, and the rate of monomer flow through the valve 56.

Figure 6:
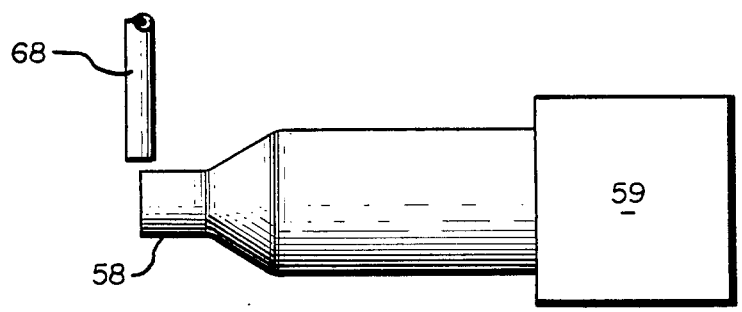
FIG. 6 is an alternate apparatus to that shown in FIG. 5.

An alternate arrangement for atomizing the liquid monomer is suggested in FIG. 6 wherein the monomer is directed through a capillary tube 68 to a point closely adjacent the horn 58 of the ultrasonic atomizer 59. In this arrangement, a meniscus is formed between the end of the capillary tube 68 and the end of the horn 58, and the monomer is drawn uniformly through the tube.

Figure 6A:
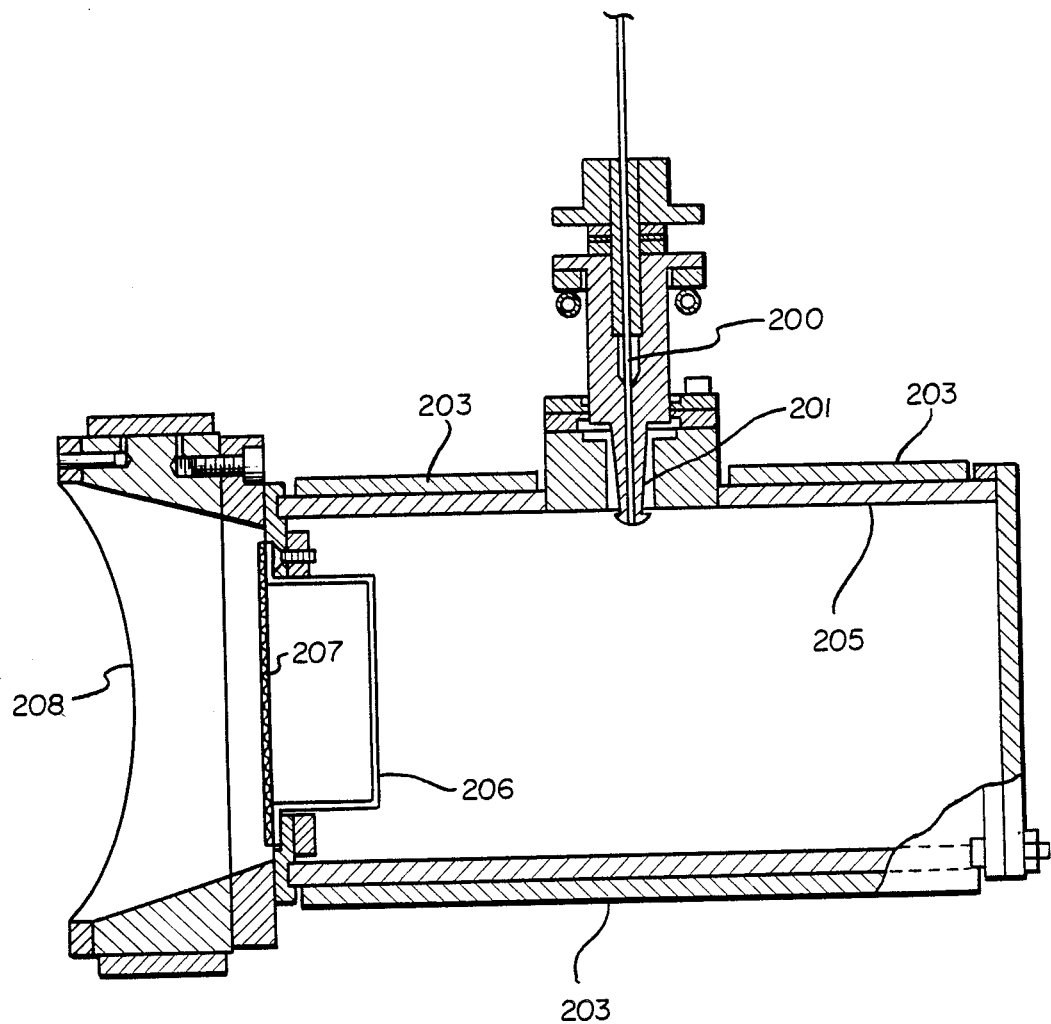
FIG. 6a shows an enlarged partially sectioned, diagram of a preferred dielectric flash evaporator apparatus.

Another system which is preferred for atomizing the liquid monomer is shown in FIG. 6a in which monomer is directed through capillary tube 200 to a point closely adjacent ultrasonic atomizer 201. The monomer droplets are atomized ultrasonically and the droplets vaporized by the means of heating elements 203, 204 which heat the walls of atomization chamber 205. The vaporized monomer passes through a top hat shaped baffle 206, screen 207 and nozzle 208, where it condenses on the movable support, not shown. Nozzle 208 is shaped to conform substantially to the shape of the surface of the movable drum.

Other systems which may be utilized for depositing a monomeric film on a substrate are disclosed in pending application Ser. No. 877,175 filed June 23, 1986 of Angelo Yializis entitled, "Flash Evaporation of Monomer Fluids", pending patent application Ser. No. 900,941 filed Aug. 25, 1986 of Gregg Bischoff entitled, "Monomers Atomizer For Evaporation" and in application Ser. No. 850,427 filed Apr. 8, 1986 of Mooyoung Ham entitled, "Atomizing Device For Vaporization", the disclosures of which are incorporated by reference herein.

Figure 7:
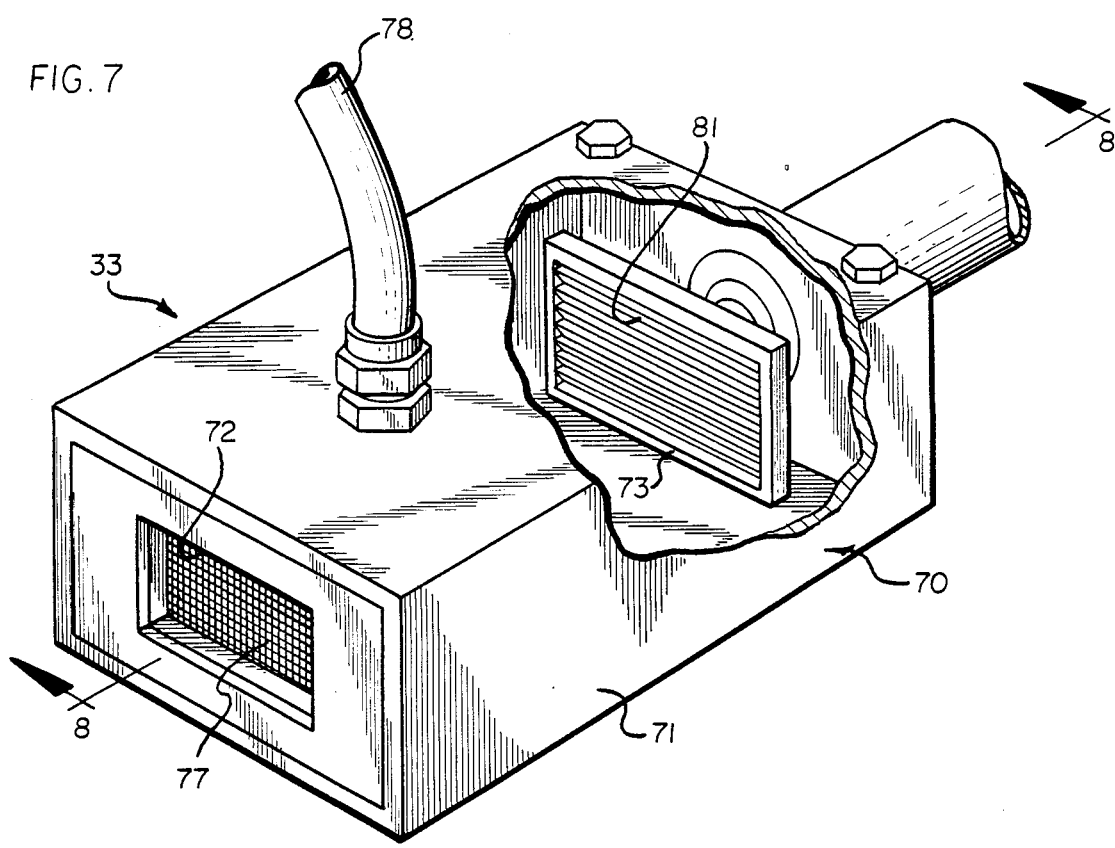
FIG. 7 is a fragmentary perspective view, partially sectioned, of a portion of the apparatus shown in FIG. 1; and, FIG. 8 is a sectional view taken along the line 8—8 in FIG. 7.
Figure 8:
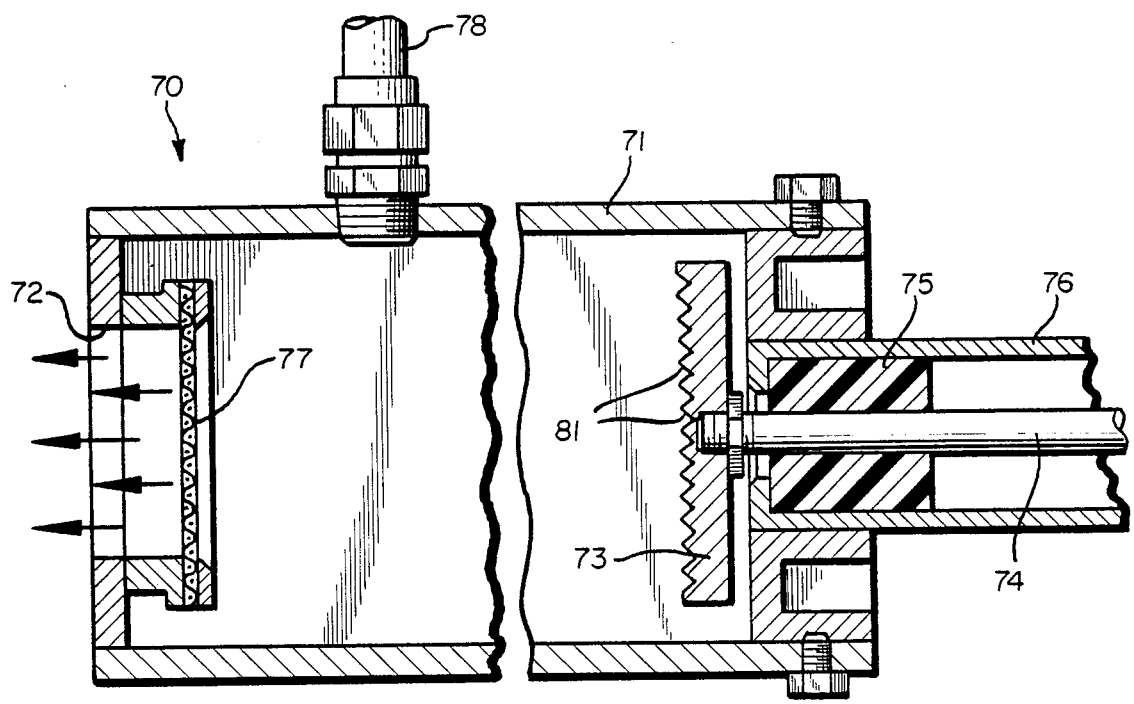

Referring now to FIGS. 1, 7 and 8, the condensed liquid monomer is radiation cured by the second system 33 in the dielectric forming zone which includes a radiation source, preferably a gas discharge electron beam gun 70. The gun 70 directs a flow of electrons from a housing chamber 71 through an emitter window 72 onto the monomer, thereby curing the material to a polymerized cross linked form capable of withstanding high temperatures. Curing is controlled by matching the electron beam voltage to the dielectric thickness. For example, a 10 Kv electron voltage will penetrate about 1 micron of deposited monomer.

The gun 70 includes a rectangular copper cathode 73 supported by a connector 74 in an insulator 75 mounted in a ground shield 76 that is fixed to the housing 71. A tungsten mesh extraction screen 77 is fixed across the window 72. A gas such as argon is fed to the housing chamber 71 through a line 78 and a control valve 79. An electrical potential is imposed between the cathode 73 and its connector 74, and the shield 76, housing 71 and screen 77, with the result, keeping in mind the vacuum environment, that a gaseous plasma is created in the housing, primarily between the cathode 73 and the screen 77. The cathode is preferably formed with grooves 81 on its face so that electrons are expelled in a non-linear beam to substantially fill the housing chamber 71. Because of the plasma created, other electrons are stripped from the ionized gas molecules in different portions of the chamber, a so-called field enhanced effect, with the result that electrons at widely varying energy levels are emitted from the window 72. The wide range of energy levels of the emitted electrons is believed to cause the observed effect that the monomer is cured with little surface charging. Other types of electrons guns (i.e., thermionic guns) can be employed.

Figure 2:
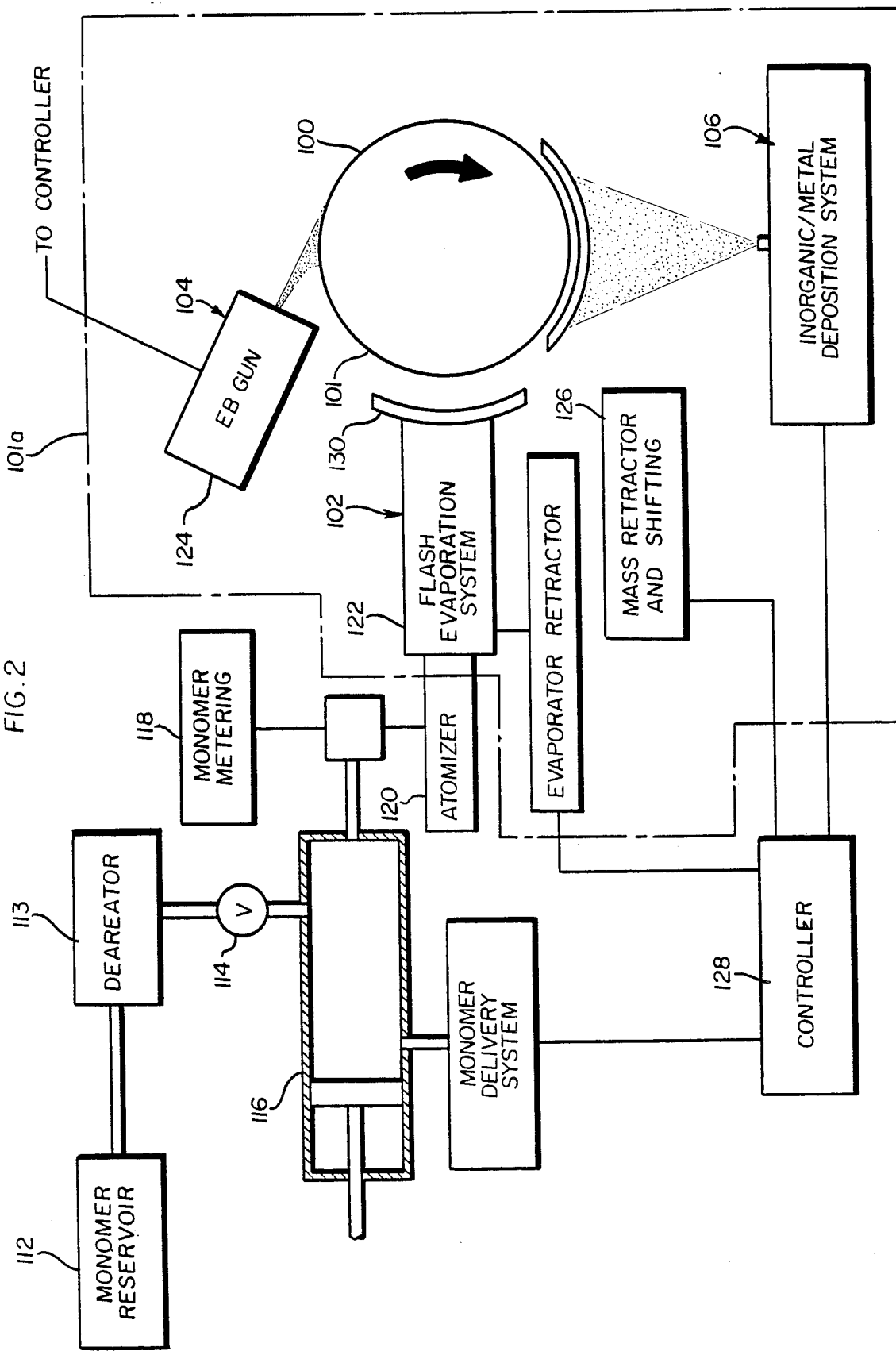
FIG. 2 shows a schematic view of a second, preferred embodiment of apparatus and system for carrying out the process of the invention.

FIG. 2 illustrates a second, preferred embodiment of apparatus which can be employed in the method of the present invention. There is shown within a vacuum environment in a vacuum chamber 101a or a housing devided into vacuum portions, a movable support in the form of a rotatable drum 100 having a cooled surface 101 driven by a motor, not shown. A liquid monomer delivery, metering and deposit system 102, a monomer curing system 104, and a metal or inorganic material deposit system 106 are also shown. The movable drum support 100, the vapor outlet of the monomer flash vaporizer, the curing means and optional inorganic material deposit apparatus 106 are disposed within the vacuum environment.

Drum 100 continuously rotates the cooled drum surface 101 through an upstream polymer layer forming zone. The region in which surface 101 passes the monomer condensation and downstream curing systems 102, 104 constitutes the polymer layer forming zone, whereas the region in which the drum surface 101 passes the inorganic material deposit system 106 constitutes the inorganic or metal forming zone.

Deposit system 106 is optional. If desired, inorganic material deposit system 106 could be eliminated if a single layer of organic coating is all that is desired. Alternatively, system 106 could be replaced by a second liquid monomer delivery, metering and deposit system (not shown) similar to system 102. This second monomer system could be used to deposit a second layer of the same or different monomer mixture on the substrate, if desired.

Figure 3:
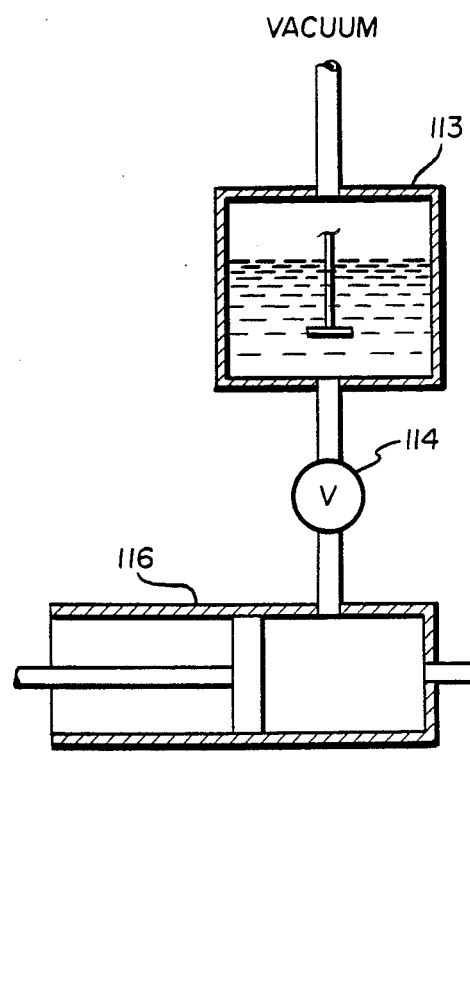
FIG. 3 shows a fragmentary schematic view of an embodiment of a monomer feeding system for depositing a metered amount of monomer to be deposited on a movable support.

Referring to FIGS. 2 and 3, a liquid monomer at room temperature is deposited in reservoir 112 where it passes to a dearator 113 where the monomer is stirred and degased at a temperature of about 25° C. by pulling a vacuum to remove gases entrained in the monomer to preclude, insofar as possible, any pressure variation in the monomer evaporator. The monomer then passes through valve 114 to a conventional piston pump 116 which pumps the monomer under suitable pressure and temperature to a monomer metering means 118 which meters a desired amount of monomer to ultrasonic atomizer 120 through constricted conduit 121 which provides a positive back pressure for the monomer entering atomizer 120. The monomer is atomized and forms micro droplets which are heated to an appropriate temperature, approximately 100°–400° C. for the acrylate resins referred to above. The droplets are instantaneously vaporized, i.e., flash vaporized, in evaporator 122 to minimize the opportunity for polymerization and the vaporized monomer condenses on the cooled drum surface 101. A flow rate of the monomer through the constriction 121, generally in the range 0.5 to 10 cc/min. has been found satisfactory with the flow rate being dependent upon the speed of the movable support, the desired layer thickness, and the width of the deposit. The monomer is metered in order that the amount of monomer entering atomizer 120 will be the optimum amount deposited on the movable support. It is important that the metered monomer material is deposited on the movable support, otherwise the monomer will polymerize on the walls of the evaporator.

The condensed monomer liquid is subsequently radiation cured in the polymer or dielectric forming zone which includes a radiation source, preferably a gas discharge electron beam gun 124. Activation of gun 124 in the manner previously described for the electron beam gun system of FIG. 1, causes a flow of electrons to be directed onto the monomer, thereby curing the material to a polymerized cross linked form. In the embodiment of FIG. 2, the gun is positioned to be aligned tangentially to the drum surface 101 in order that the flow of electrons contact the monomer tangentially as opposed to the 90° angle disclosed in FIG. 1. It has been found that by positioning the gun in the manner described for the embodiment of FIG. 2, the surface charge is reduced, charging defects are eliminated, and a more uniform cure from the top to the bottom of the monomer layer is achieved.

The cured monomer then passes to the optional inorganic material deposit system 106 where an inorganic material such as aluminum can, if desired, be deposited on the cured monomer layer. An inorganic metal deposition system 126 is provided which is similar to the mask retraction and shifting system shown in FIG. 1, which comprises a controller 50, mask shifting motor 47, mask retractor motor 51 and removable shutter 52.

A controller 128 is connected to the drum motor, not shown, for sensing drum revolution. Controller 128 serves to provide the appropriate signals to the monomer delivery system, flash vaporization retractor 130, which positions the vaporizer the desired distance relative to the drum surface, and the electron beam curing system for activating the curing system. The controller 128 can also supply the appropriate shifting to the mask retraction and shifting means, if a mask is employed.

Figure 4A:
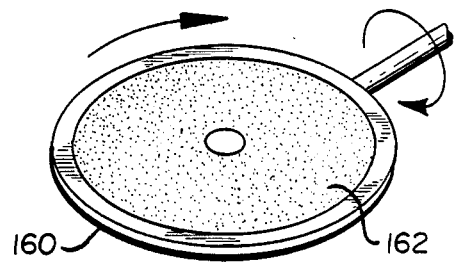
FIG. 4a shows a fragmentary perspective view of another embodiment of a movable support with the support being a rotatable disk.
Figure 4B:
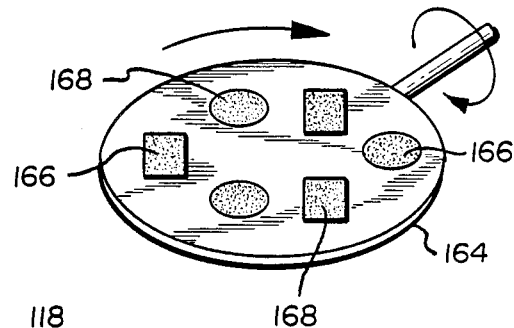
FIG. 4b shows a fragmentary perspective view of further embodiment of a movable support with the support being a continuously or intermittently indexed rotatable disk.

If desired, the rotatable drum shown in FIGS. 1 and 2 can be replaced with other types of movable supports. For example, referring to FIG. 4a, there is shown a rotatable disk 160 which could serve as a movable support with a cured adherent film 162 being formed on the surface of the disk. Again, turning to FIG. 4b, there is shown a disk 164 which is adapted to be rotated continuously or indexed intermittently at a desired speed, past deposition and curing stations heretofore described, to provide a number of coated substrates 166, 168.

Figure 4C:
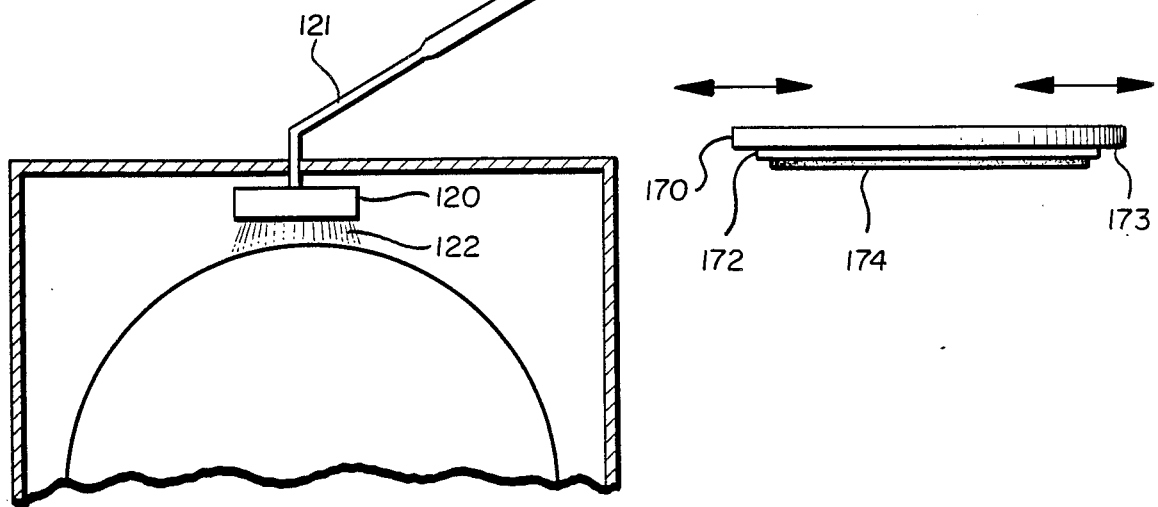
FIG. 4c shows a fragmentary perspective view of yet another embodiment of a movable support with the support being a reciprocating plate with the reactive monomer being depostied on a substrate located on the bottom wall of the plate.

FIG. 4c shows a movable support which comprises a reciprocating plate 170 having a substrate 172 attached to a cooled surface 173. A cured monomer film 174 has been deposited on substrate 173.

Figure 4D:
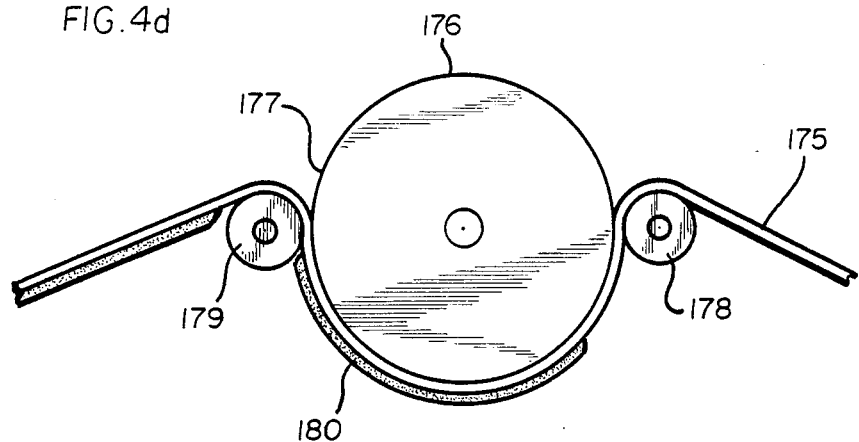
FIG. 4d shows a fragmentary perspective view of still another embodiment of a movable support in which a moving web substrate serves as the support and a reactive monomer is deposited on the bottom wall thereof.

FIG. 4d a shows a rotatable drum 176 with a water cooled surface 177. A moving web substrate passes over rollers 178, 179, the rollers serving to maintain the moving substrate in contact with the drum surface so that it can be cooled by the drum. While the substrate is in contact with the drum surface, a monomer coating 180 can be applied to the moving substrate and cured.

It is appreciated that other structures for movable supports, aside from those shown and described herein, could be utilized by a person of ordinary skill in the art.

We claim:

1. A high-speed process for coating the surface of a substrate with an adherent film comprising the following steps:
   (a) providing a vacuum chamber containing: (i) a movable support, (ii) a vapor outlet of a vaporizer mounted adjacent to an upstream portion of said support, (iii) curing means mounted adjacent to a downstream portion of said support, and (iv) means for maintaining said support at a temperature below that of said vaporizer;
   (b) placing said substrate in thermal contact with said movable support in a manner permitting the surface of said substrate to move sequentially past said vapor outlet and said curing means;
   (c) evacuating gas from said chamber until the pressure within said chamber is less than about $1 \times 10^{-2}$ Torr;
   (d) selecting a curable component having an average of about two or more olefinic groups per molecule, an average molecular weight between 150 and 1000, and a vapor pressure in the range of $1 \times 10^{-6}$ to $1 \times 10^{-1}$ Torr at standard temperature and pressure;
   (e) metering a quantity of said curable component into an inlet portion of said vaporizer;
   (f) vaporizing said component within said vaporizer;
   (g) moving said support at a speed sufficient to pass said substrate relative to said vapor outlet and said curing means at a rate between about 1 cm/sec and 1000 cm/sec;
   (h) condensing a film of said component on the surface of said substrate, said film having a thickness of less than 4 microns; and
   (i) activating said curing means whereby a adherent film is formed on said substrate surface.

2. The process of claim 1 wherein said vaporizer comprises means for flash vaporization of said curable component.

3. The process according to claim 1 wherein said curable component is selected from the group consisting of polyacrylates and mixtures of monoacrylates and polyacrylates.

4. The method of claim 3 wherein said polyacrylate has the formula:

$$R^1-(OC-\overset{O}{\overset{\|}{C}}=CH_2)_n \atop R^2$$

wherein:
R$^1$ is an aliphatic, alicyclic or mixed aliphatic-alicyclic radical derived from a compound of the formula R$^1$(OH)$_m$;
R$^2$ is hydrogen, methyl, ethyl, propyl, butyl or pentyl;
n is from 2 to 4;
m is 2 or more.

5. The method of claim 3 wherein said monoacrylate has the formula:

$$CH_3(CH_2)_r\overset{X^1}{\underset{CH_2OC-C=CH_2}{\overset{|}{C}}}-(CH_2)_sX^3 \atop \overset{\|}{O}\ \overset{|}{R^2}$$

wherein:
R$^2$, r and 2 are defined above;
x$^1$ is H or:

$$CH_2OC-\overset{O}{\overset{\|}{C}}=CH_2; \atop R^2$$

and
X$^3$ is CN or COOR$^3$ wehrein R$^3$ is an alkyl radical containing 1-4 carbon atoms.

6. The method according to claim 3 wherein said polyacrylate comprises a diacrylate of the formula:

$$CH_3(CH_2)_r\underset{CH_2OC-CH=CH_2}{\overset{|}{C}H(CH_2)_sCH_2OC-CH=CH_2} \atop \overset{\|}{O}$$

wherein:
r and s are each 7 or 8 and the sum of r and s is 15.

7. The method of claim 3 wherein said polyacrylate is selected from the group consisting of:
(a) 1,6-hexane diol diacrylate;
(b) alkoxylated cyclohexane dimethanol diacrylates wherein the alkoxy group contains 1 to 4 carbon atoms; and
(c)

$$CH_3(CH_2)_8CH_2CH(CH_2)_7-OOCCH=CH_2 \atop \underset{HC=CH_2}{\overset{O}{\underset{|}{\overset{|}{C=O}}}}$$

8. A process according to claim 1 wherein said movable support comprises a rotating drum.

9. The method according to claim 1 wherein said movable support is maintained at a temperature in the range of about 20° C. to about 80° C.

10. The method of claim 1 wherein said movable support comprises a rotating drum and said drum passes said vapor outlet and said curing means at a rate of about 100 cm per second.

11. The method of claim 1 wherein said curing means comprises a gas discharge electron beam.

12. The method of claim 1 wherein said curing means is aligned tangentially to said film on the surface of said substrate.

13. The method of claim 1 wherein said vaporizer is maintained at a temperature between approximately 100° and 400° C.

14. The method of claim 1 wherein said film has a thickness of less than 2 microns.

15. The method of claim 1 wherein said curable component has a molecular weight in the range 200 to 300.

16. The method of claim 1 wherein said substrate is flexible and is selected from the group consisting of paper, fabrics, thin metals and plastics.

17. The method of claim 16 wherein said flexible substrate is a plastic selected from the group consisting of polyester and polyolefins.

18. The method of claim 1 further including the step:
    degassing said curable component prior to metering said component into said vaporizer inlet.

19. The method of claim 1 wherein said movable support comprises a rotatable disk.

20. The method of claim 1 wherein said movable support comprises a reciprocating plate.

* * * * *

UNITED STATES PATENT AND TRADEMARK OFFICE
CERTIFICATE OF CORRECTION

PATENT NO. : 4,842,893

DATED : June 27, 1989

INVENTOR(S) : Yializis, et al.

It is certified that error appears in the above-identified patent and that said Letters Patent is hereby corrected as shown below:

Column 2, line 17, change "proivdes" to --provides--;

Column 2, line 42, change "moilecular" to --molecular--;

Column 2, line 49, change "pressure" to --pressures--;

Column 3, line 12, change "1 X $1^{-1}$ Torr" to --1 X $10^{-1}$ Torr--;

Column 3, line 62, change "depostied" to --deposited--;

Column 6, line 24, change "lin e57" to --line 57--;

Column 6, line 27, change "wall" to --walls--;

Column 6, line 31, change "vaporized,i.e." to --vaporized, i.e.--;

Column 7, line 39, change "electrons" to --electronic--;

Column 7, line 44, change "devided" to --divided--; and

Column 10, line 38, change "wehrein" to --wherein--.

Signed and Sealed this

Twenty-ninth Day of May, 1990

*Attest:*

HARRY F. MANBECK, JR.

*Attesting Officer*      *Commissioner of Patents and Trademarks*